United States Patent [19]
Hills et al.

[11] 4,042,841
[45] Aug. 16, 1977

[54] SELECTIVELY POWERED FLIP-FLOP

[75] Inventors: Vernon Elton Hills, Hightstown; Leesui Wu, Cherry Hill, both of N.J.

[73] Assignee: RCA Corporation, New York, N.Y.

[21] Appl. No.: 631,328

[22] Filed: Nov. 12, 1975

Related U.S. Application Data

[62] Division of Ser. No. 507,780, Sept. 20, 1974, Pat. No. 4,001,613.

[51] Int. Cl.² .......................................... H03K 17/00
[52] U.S. Cl. .................................. 307/272; 307/215; 307/279; 307/288; 307/296 A
[58] Field of Search ............................ 307/288–292, 307/296 A, 272, 279, 215, 275, 235 B

[56] References Cited

U.S. PATENT DOCUMENTS

| 3,440,449 | 4/1969 | Priel et al. | 307/289 |
| 3,564,300 | 2/1971 | Henle | 307/299 A |
| 3,610,964 | 10/1971 | Hatano et al. | 307/289 |
| 3,624,425 | 11/1971 | Blumenstien | 307/299 A |
| 3,882,329 | 5/1975 | Tyau | 307/289 |

*Primary Examiner*—Stanley D. Miller, Jr.
*Assistant Examiner*—B. P. Davis
*Attorney, Agent, or Firm*—H. Christoffersen; Henry I. Schanzer

[57] ABSTRACT

A set reset flip-flop having set and reset inputs to which input signals are applied. The flip-flop is selectively powered, its output condition being determined by the difference in the two input signals when it is being powered and driven through a linear region of operation.

5 Claims, 6 Drawing Figures

SELECTIVELY POWERED FLIP-FLOP

This application relates to switching systems in general, and in particular to a switching system which responds to a change in certain external conditions, e.g., the presence or absence of a person in proximity thereto. Further, the application relates to a sensor, and to improved circuitry which may be used in conjunction with the system.

There are many applications as, for example, in a seat belt interlock system, where it is desired to detect the presence or the absence of a particular object (condition) so that a desired response to the condition may be generated. Many known detection systems use an oscillator whose frequency is altered when an object is detected. For the system to be reliable the oscillator must be relatively precise and stable and the associated circuitry must be frequency dependent. Such oscillators and circuitry and generally complex and expensive.

In many applications, especially those designed for mass markets, it is desirable that the circuitry be simple and inexpensive. This aplies to the detection system as well as to the detector or sensor used to detect a given condition. Also, in many applications, such as in automobiles where the environment is electrically very noisy, it is desirable that the circuits be relatively insensitive to noise or that the noise be cancelled out of the system.

Systems embodying the invention include a first circuit to which there is connected a sensor and a second, reference, circuit. Sampling signals are supplied to the inputs of the first and second circuits. The transfer function of the first circuit is modified by external stimuli applied to the sensor causing the amplitude of the signals produced at the output of the first circuit to vary in response to said stimuli. The outputs of the first and second circuits are compared to produce signals indicative of the presence or absence of said stimuli.

A proximity sensor for use in systems embodying the invention may include a sheet of conductive material functioning as an antenna. A first wire is connected at one end to the antenna and at its other end of said first circuit. A second wire is connected at one end to said second circuit and is terminated at its other end near, but not at, the antenna so as to be electrically isolated from the antenna. The second wire extends approximately, the full length of the first wire. The sensor may also include a third wire positioned between said first and second wires and which extends along said wires for, approximately, their full length. The third wire is terminated at one end near, but not at, said sheet of metal so as to be electrically isolated therefrom and is connected at its other end to a reference potential common to the reference potential of the first and second circuits.

In circuit embodying the invention the means for comparing the outputs of the first and second circuits may include a strobed set-reset flip-flop having the outputs of the first and second circuits connected, to its set and reset inputs, respectively. The flip-flop is selectively powered, its output condition being determined by the difference in the two inputs signals when it is being powered and driven through a linear range of operation.

In the accompanying drawing like reference characters denote like components and;

FIG. 1 is a combination circuit and block diagram showing the essential elements of a proximity sensor system embodying the invention.

Figure 1:
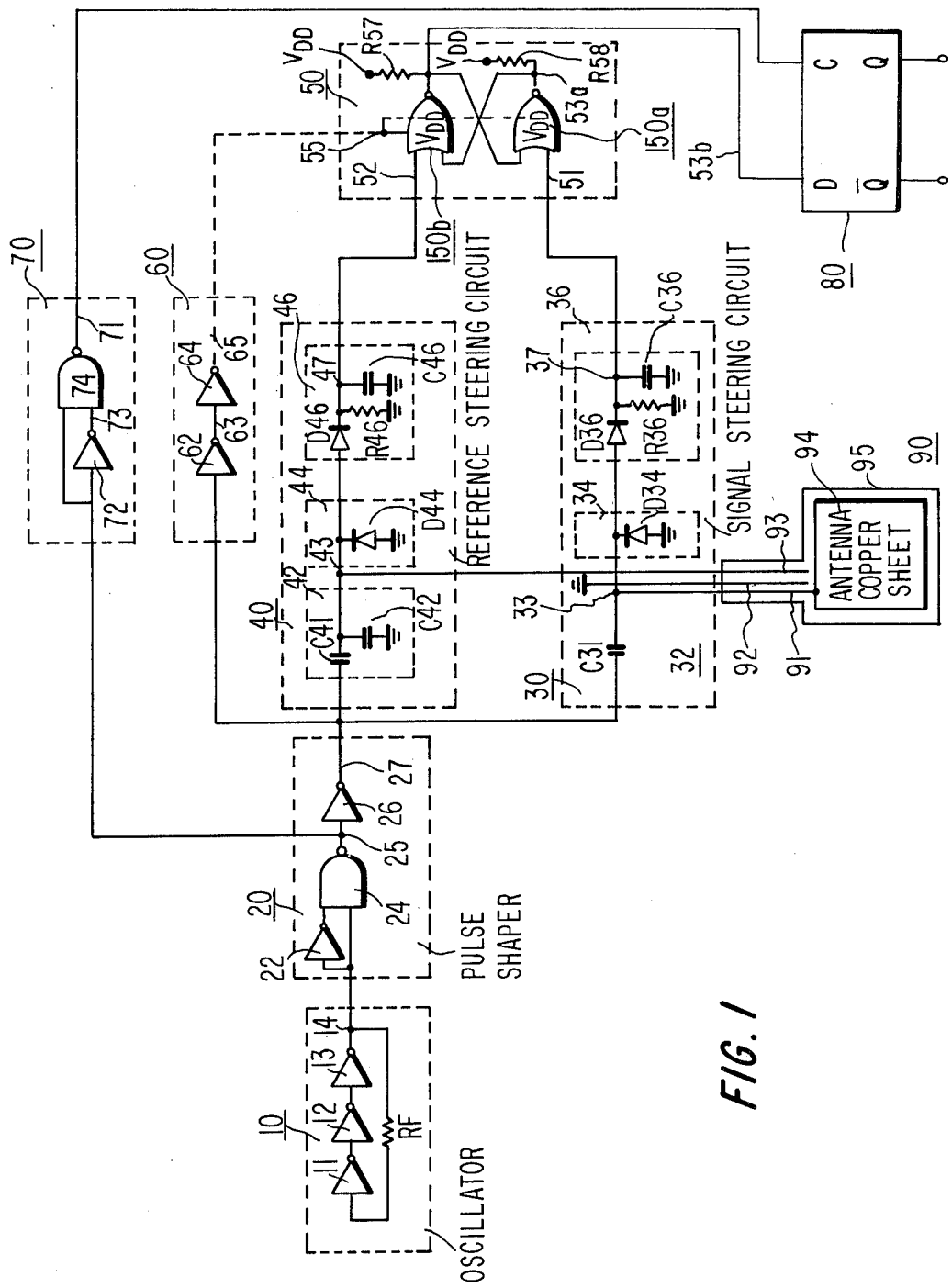
FIG. 1 is a combination schematic and block diagram of a proximity sensor system embodying the invention.

The system includes a free running oscillator 10 which produces clock signals fed to a pulse shaper 20. The oscillator 10 includes three inverters 11, 12, and 13, connected in cascade, with the output 14 of inverter 13 fed back to its input by means of resistor $R_F$. The frequency of oscillation is not critical to the system. Frequencies below 500 KHz are desired to minimize power dissipation and to eliminate interference between systems when numerous systems are manufactured on the same intergrated circuit chip or in close proximity. The feedback resistors $R_F$ can be varied to produce different oscillators frequencies. The frequency of the oscillator may also be varied by varying the number of inventers connected in cascade. On a large scale integrated (LSI) circuit these inverters are made to have high impedances in order to reduce the power dissipation.

Figure 2:
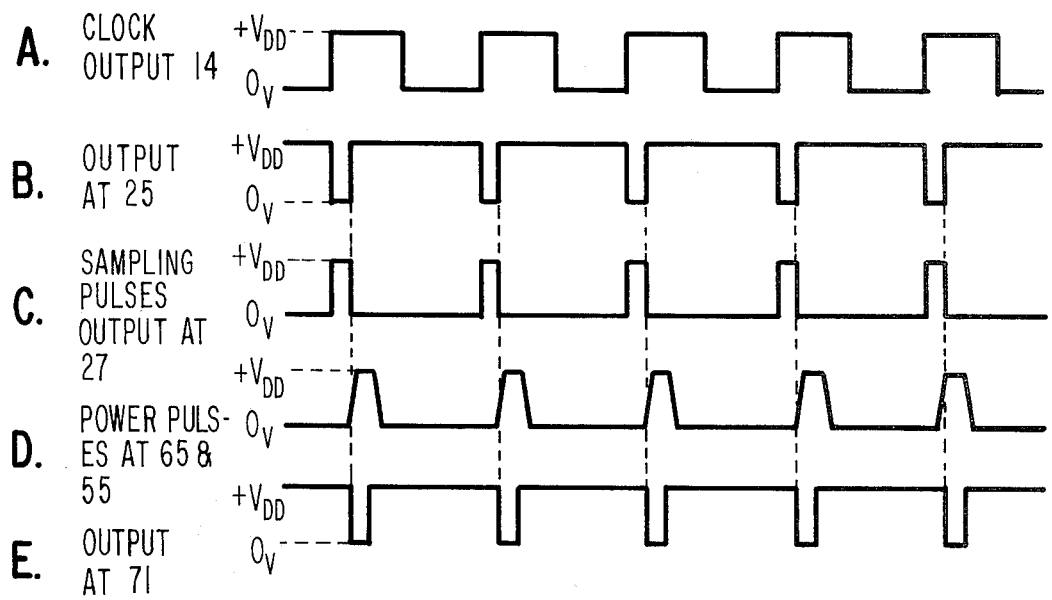
FIG. 2 is a diagram of waveforms produced at various points of the system.

The clock pulses produced at output 14 are relatively symmetrical as shown in waveform A of FIG. 2. The clock pulses are fed to one input of inverter 22 and one input of NAND gate 24 in pulse shaper 20. The output of inverter 22 is connected to the other input of gate 24. Inverter 22 and gate 24 form a positive edge detectors producing at output 25 of gate 24 a narrow, negative-going pulse every time the output of oscillator 10 goes positive, as shown in waveform B of FIG. 2. The negative going pulses produced at output 25 are applied to the input of inverter 26 which produces, at its output 27, narrow positive going sampling pulses having a repetition rate equal to the frequency of the oscillator 10 as shown in waveform C of FIG. 2. Narrow sampling pulses are used because, as detailed below, they are more easily absorbed by objects coming into proximity with sensor 90. The pulse width is adjusted, by design, by adjusting the impedance of inverter 22 and the input capacitance of NAND gage 24. Output 27 of inverter 26 is applied in parallel to circuits 30, 40, and 60.

Steering circuits 30 and 40 each include a voltage divider network 32 or 42, in direct current (D.C.) restoration circuit 34 or 44, and a peak detection circuit 36 or 46. The restoration and peak detection circuits of steering circuits 30 and 40 may be identical. The sampling pulses are fed to capacitive voltage divider sections 32 and 42. Voltage divider 42 includes capacitor C41 connected between nodes 27 and 43 (node 43 functions as the output of voltage divider 42) and capacitor C42 connected between node 43 and ground. Capacitors C41 and C42 are fixed in value and substantially invariable with respect to changes in the proximity sensor. Therefore, the pulses applied to the input of voltage divider 42 are divided down in amplitude by a relatively fixed ratio, and the pulses produced at node 43 are of relatively constant amplitude with respect to sensor variations. Voltage divider 32 includes capacitor C31 connected between nodes 27 and 33, with node 33 functioning as the output of voltage divider 32. Capacitor C31 has preferably the same value as capacitor C41. The sensor 90 connected to node 33 functions as a variable capacitor and, in terms of voltage dividing action, performs a similar function to that performed by capacitor C42. The difference in the two circuits is that capacitor C42 is fixed, whereas the capacitance between node 33 and ground varies as objects come into proximity to the sensor.

Figure 3:
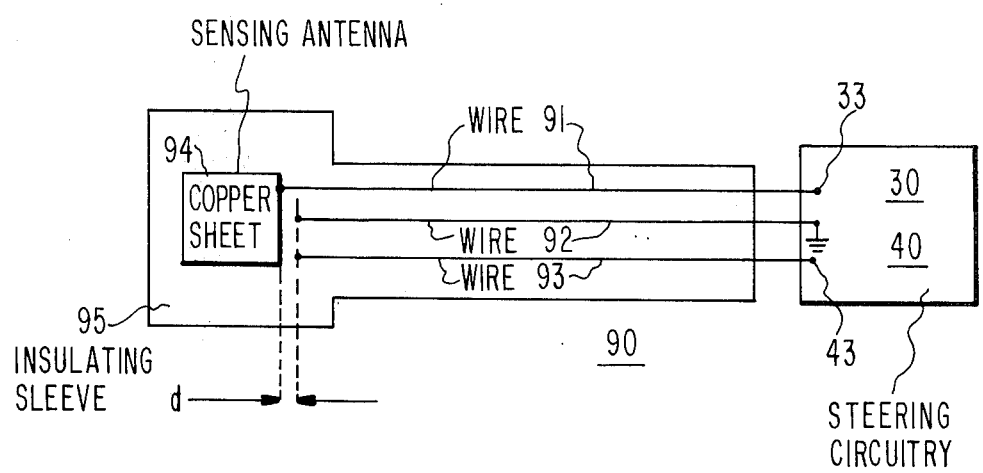
FIG. 3 is a detailed drawing of a preferred proximity sensor.

The sensor, shown in FIG. 3, comprises a single sheet 94 of suitable conductive material such as copper, of any selected shape which constitutes the basic sensing antenna. The size of the sheet is determined by the proximity sensitivity in the system. Three wires, 91, 92 and 93, run side by side from the copper sheet to steering circuits 30 and 40. Wire 91 is connected at one end to the antenna 94 and at its other end to output node 33 of divider 32. Wire 91 functions to couple the variable capacitance represented by copper sheet 94 (sensing antenna) to node 33. Wires 92 and 93 are terminated at one end a distance d, which is not critical, from the antenna. Wires 92 and 93 are thus electrically isolated from the copper sheet. Wire 92 is connected at its other end to the sensing circuit ground potential. Wire 93 is connected at its other end to output node 43 of the divider network 42 of steering circuit 40.

An insulating sleeve 95, which may be a sheet of plastic, is formed around the copper sheet 94 and wires 91, 92, and 93 to maintain the shape of the antenna and the wire assembly. Wire 91 may be in an electrically noisy environment, and due to its length may pick up extraneous noise pulses. Thus, wire 91 carries both the sensor signals from the copper sheet and ambient noise signals received from the environment. Wire 93 runs alongside wire 91 and its function is to pick up the same background noise sensed by wire 91. Wire 92, which is grounded at one end, functions as a shield to prevent the signal present on wire 91 from being coupled to wire 93. Since the ends of wires 92 and 93 near the copper sheet 17 are left floating, the antenna is independent of ground reference and no sophisticated ground reference has to be established for the antenna.

The use of wires 91 and 93 enables the performance of the antenna assembly to be independent of the length of the cable comprising the two wires. Since wires 91 and 93 are substantially the same length and are routed through the same environment, it may be assumed that the noise signals fed by wires 91 and 93 into nodes 33 and 43, respectively, have substantially the same characteristics. Furthermore, since the signals from wires 91 and 93 are eventually compared and subtracted from each other in comparator circuit 50, the effect of the length of the wires is cancelled out of the system. Therefore, only the antenna size, with respect to its environment determines the capacitance of the system. Thus, the sensor system is, to a first approximation, independent of antenna cable length. This is especially important, for example, in an automobile seat belt interlock system, where different automobiles have different seat shapes and where the different location of the seats introduces different cable length as well as different environmental conditions.

Functionally, the copper sheet 94 may be viewed as one side or plate of a conventional capacitor with the environment surrounding the copper sheet forming and comprising the other side of the capacitor. The antenna assembly thus functions as a capacitor whose capacitance is altered (increased) by the presence of an object such as a human body. A human body coming in close proximity to the antenna alters the dielectric constant of the capacitor and changes (increases) its capacitance. The function performed by the antenna may also be viewed as follows. Pulses applied to terminal 33 travel along wire 91 to copper sheet 94. An object such as a human body in close proximity to the copper sheet absorbs the energy transmitted to the copper sheet and thereby affects (decreases) the amplitude of the pulse at terminal 33. For ease of discussion it will be assumed that the antenna functions as a variable capacitor whose capacitance increases when an object comes into close proximity thereto.

Returning to FIG. 1, the voltage divider ratio of network 32 varies as a function of objects coming into proximity with the sensor. Therefore, the impedance and transfer function of divider network 32 to sampling pulses is variable, being a function of the sensor impedance. Voltage divider network 42 is comprised of capacitor whose impedances are relatively constant and fixed and independent of sensor variations. Therefore, the transfer function of circuit 40 to sampling pulses is relatively constant. The transfer function as used herein, refers to the ratio of the output to the input of a circuit where the output may be the output voltage or current of the circuit and where the input may be the input voltage or current of the circuit. The terms "constant" and "fixed" as used above refer to the components and the transfer ratio being insensitive to changes caused by the sensor. But, obviously, these elements may change due to temperature or aging or other environmental factors such as radiation.

In the operation of the system, network 42 functions as a reference circuit producing pulse signals of constant amplitude at its output 43. The amplitude of the pulse signals produced at output 33 of network 32 vary as a function of objects coming into proximity with sensor 90. As mentioned above, ambient noise signals are added to the potentials at nodes 33 and 43. A pulse at node 33 thus includes a signal component and an ambient component, and the pulse at node 43 includes an ambient noise component comparable to the ambient noise component introduced at node 33.

If the capacitance of the sensor is equal to that of capacitor C42 and if capacitors C31 and C41 are equal, then the pulse signals produced at terminals 33 and 43 will be substantially equal. In practice, the capacitance of capacitor C42 is preferably selected to be slightly greater than the capacitance of the sensing antenna when no objects are in proximity to the antenna. Accordingly, in the absence of objects in proximity to the sensor, the pulses produced at output 33 will have a greater amplitude than the pulses produced at output 43. If the capacitance of the sensor increases beyond that of capacitor C42, the amplitude of the pulses at output 43 will be greater than those produced at output 33.

Circuits 30 and 40 also include D.C. restoration circuits 34 and 44 each of which includes a diode, D34 and D44, respectively, connected between outputs 33 and 43, respectively, and ground. The function of D.C. restoration circuit is to restore the D.C. level at the outputs of the voltage dividers to approximately zero volts each time the sampling pulses applied to the inputs of the voltage dividers terminate and make a negative going transition. The outputs (nodes 33 and 43) of divider network 32 and 42 are fed to peak detector circuits 36 and 46, respectively. Each peak detector circuit includes a diode (D36 and D46) connected at its anode to the output (33 or 43) of its voltage divider and at its cathode to the output (37 or 47) of its peak detector. Each detector includes a resistor (R36 or R46) and a capacitor (C36 or C46) connected between its output (37 or 47) and ground potential. The values of the corresponding components in circuits 34, 44, 36, and 46 are preferably the same. Neglecting the drops in diodes D36 and D46, capacitors C36 and C46 are charged to approximately the peak value of the positive going pulse signals present at nodes 33 and 43, respectively. The time constant of the capacitor and resistor of each peak detector is selected to be considerably greater than the sampling interval, where a sampling interval is the pulse width of a sampling pulse.

Outputs 37 and 47 are connected to inputs 51 and 52, respectively, of comparator or difference circuit 50. The comparator when enabled, produces at its outputs 53a and 53b pulse signals indicative of which of the two input signals applied to the comparator has the greater amplitude.

The sampling pulses applied to circuits 30 and 40 are also applied to circuit 60. Circuit 60 which functions as a delayed strobe, includes two cascade inverters 62 and 64 connected between none 27 and the positive operating potential terminal 55 of circuit 50. In response to each sampling pulse, circuit 60 produces a positive going power pulse at terminal 55, the power pulse being slightly delayed with respect to the positive going edge of the sampling pulse due to the propagation delays of inverters 62 and 64. Comparator 50 could be any one of a number of known comparators or differential amplifiers. But, using a strobed flip-flop as a difference amplifier or comparator circuit has distinct advantages discussed below.

Figure 4:
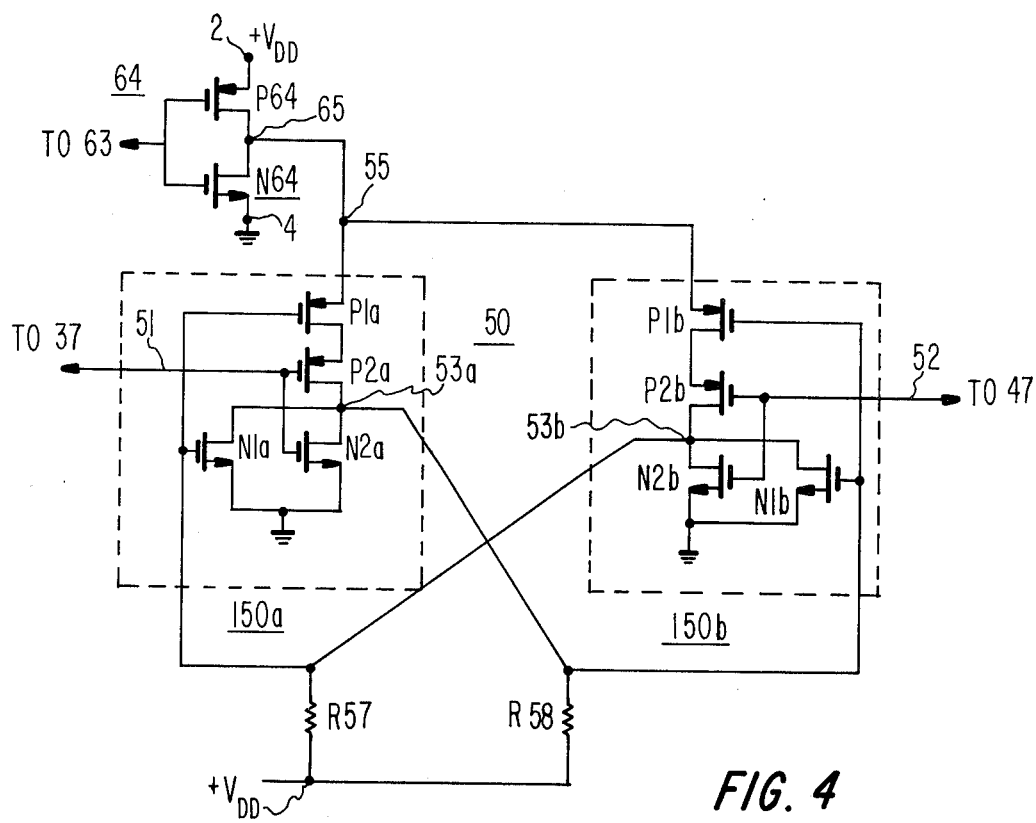
FIG. 4 is a detailed schematic diagram of a preferred comparator circuit for use in the system of FIG. 1.

The structure and operation of a perferred difference circuit is best explained with reference to the detailed schematic shown in FIG. 4. In FIG. 4, complementary insulated-gate field-effect transistors are used. Transistors of P-conductively are indicated by an arrow pointing towards the body of the transistor and are identified by a reference number bearing the letter P, followed by a numeral. Transistors of N-conductivity type are indicated by an arrow pointing away from the body of the transistor and are identified by a reference number comprised of the letter N, followed by a numeral. A P-type transistor is turned on when the potential applied to its gate is $V_T$ volts less than the potential applied to its source electrode, and on N-type transistor is turned on when the potential applied to its gate is $V_T$ volts more positive than the potential applied to its source electrode. $V_t$ represents the threshold voltage of the transistor. The threshold voltage ($V_T$) is the value of gate-to-source potential at which the transistor begins to conduct and, for ease of discussion, it is assumed that all the transistors have the same $V_T$.

Circuit 50 is comprised of NOR gates, 150a and 150b which are cross-coupled to form a flip-flop. Each NOR gate includes two P-type transistors having their source-drain paths connected in series between the output (53a or 53b) of the NOR gate and power terminal 55, and two N-type transistors having their source-drain paths connected in parallel between the output (53a or 53b) of the gate and ground. Each NOR gate has two inputs, one input being connected to the gates of a complementary pair of transistors (P2a and N2a or P2b and N2b) and the other input being connected to the gates of the other pair of complementary transistors (P1a and N1a or P1b and N1b). Inputs 51 and 52 of NOR gates 150a and 150b are connected to outputs 37 and 47, respectively of steering gates 30 and 40, and the other input of each NOR gate is connected to the output of the other NOR gate.

Terminal 55 is that terminal of the NOR gates to which an operating potential of $+V_{DD}$ volts is normally applied. However, in circuits embodying the invention, the operating potential is supplied by means of a switch such as inverter 64 of circuit 60. Inverter 64 includes transistor P64 having its source-to-drain path connected between terminal 2, to which is applied $+V_{DD}$ volts, and inverter output 65, and transistor N64 having its source-drain path connected between output 65 and terminal 4 to which is applied ground potential. The gates of transistors P64 and N64 are connected in common to output 63 of inverter 62. In the discussion to follow a potential at, or close to, $+V_{DD}$ volts is defined as "high," and a potential at, or close to, ground is defined as "low."

Whenever a positive going sampling pulse is applied to inverter 62 (FIG. 1), its output 63 goes low, and when the sampling pulse terminates the output 63 of inverter 62 goes high.

When the signal applied to the gates of transistors P64 and N64 is high, transistor N64 is turned on and discharges the potential at terminal 55 to a low value through its conduction path. When the signal applied to the gates of transistors N64 and P64 is low, transistor P64 is turned on and charges the potential at terminal 55 towards $+V_{DD}$ volts through its conduction path.

As shown in waveform D of FIG. 2, the potential at terminal 55 rises from zero volts to $+V_{DD}$ volts in synchronism with each sampling pulse. Due to the propagation delays in inverters 62 and 64, the power pulse to terminal 55 is applied some small but finite time after the sampling pulse is initially applied to circuits 30 and 40. This ensures that the signals produced by circuits 30 and 40 are present at inputs 51 and 52 when the power pulse is applied to circuit 50. Also, due to the capacitance of circuit 50, the rise-time and fall-time of the power pulse at terminal 55 will be longer than the rise and fall time of the sampling pulse. A positive going pulse slightly delayed with respect to the leading edge of the sampling pulses is, therefore, supplied to terminal 55 every time a sampling pulse is applied to circuits 30 and 40.

To better understand the operation of circuit 50, assume the initially the potential at terminal 55 is at zero volts and that in response to a sampling pulse the potential at terminal 55 begins to rise from zero volts towards $+V_{DD}$ volts. As the potential applied to terminal 55 increases, the threshold voltage of the transistors in NOR gates 50a and 50b is reached and the transistors are operated in the linear region where their gain is very high. Each one of gates 50a and 50b then functions at least momentarily, as a linear inverting amplifier. It should be kept in mind that, concurrently with the application of the power pulse the terminal 55, the sampling pulse applied to circuits 30 and 40 causes pulses to be produced at terminals 37 and 47, respectively, which are in turn applied to inputs 51 and 52, respectively. The pulse to input 51 includes a signal and a noise component and the pulse to input 52 includes a noise component.

Assume for ease of explanation that the potential to input 51 — a section of the circuit — is very slightly more positive than the potential to input 52 — the b portion of the circuit. As a result, the potential at terminal 53a will be slightly lower than the potential at terminal 53b. The lower potential at terminal 53a is fed to the gates of transistors P1b and N1b. At the same time, the slightly higher potential at terminal 53b is fed to the gates of transistor P1a and N1a.

The signal fed back to the a portion of the circuit causes the signal at output terminal 53a to go even lower, whereas the signal fed back to the b portion of the circuit causes the potential at its output 53b to go still higher. The positive feedback provided by the crossconnection continues to operate until the circuit is driven into saturation. If, as assumed, the potential input to 51 is greater than that at 52, the signal at 53a gets clamped to ground potential and the signal at 53b gets clamped to the potential at terminal 55. Vice-versa, if the potential input to 51 is less than that at 52, the signal at 53a gets clamped to the potential at terminal 55 and the signal at 53b gets clamped to ground potential.

Thus, due to the cross-connection of the circuit, a very small imbalance is greatly amplified. As the power ramp (i.e., the positive potential applied to terminal 55) increases to $+V_{DD}$ volts, the cross-coupled flip-flop, which functions as a regenerative switch, locks into the voltage condition sensed when the threshold voltage of the NOR gate transistors was reached. With approximately $+V_{DD}$ volts applied to terminal 55 and the circuit locked into one of its two states the noise immunity of the circuit becomes very high and the imbalance between inputs 51 and 52 must be in the order of volts in order to cause the flip-flop to switch from one state to another state. The strobed flip-flop is most sensitive to the signals applied to its inputs when the flip-flop is reaching its threshold condition. That is, the flip-flop is extremely sensitive when the potential at terminal 55 rises above the threshold voltage level of the transistors of the circuit. At that point, the slightest imbalance between the two inputs to the flip-flop causes the flip-flop to favor the condition of that signal having the highest amplitude.

It should be appreciated that the flip-flop, which normally has a relatively high noise immunity when in one or the other of its two stable states, can be used to detect signal differentials in the order of millivolts. Once the flip-flop has sensed a small difference in input signals while it is being strobed, it latches on to that condition and assumes a condition reflective of the small difference. When the potential at terminal 55 is at, or close to, $+V_{DD}$ volts, the flip-flop produces an output signal which will be either high or low and the flip-flop is locked to that condition.

Resistors R57 and R58 connected between outputs 53b and 53a, respectively, and $+V_{DD}$ volts are optional. These resistors which, if used, are made to have a high resistance prevent the inputs to flip-flop 80 from floating and also provide load equalization.

The signal condition at outputs 53a and 53b of comparator 50 is only valid during the time a power pulse is applied. To store the condition produced during the sampling interval, one of the outputs (53b) of comparator 50 is fed into the data input (D) of flip-flop 80. Flip-flop 80 may be any one of a number of known clocked flip-flops. The clock input (C) of flip-flop 80 is connected to the output of circuit 70.

Circuit 70 includes NAND gate 74 and inverter 72 and functions as a positive going edge detector. One input of gate 74 and the input of inverter 72 are connected to output 25. The output 78 of inverter 72 is connected to the other input of gate 74. Gate 74 produces at its output 71, as shown in waveform E of FIG. 2, a negative going pulse each time the signal at output 25 makes a transition from zero volts to $+V_{DD}$ volts. The pulse width is adjustable during design and processing by adjusting the impedance of inverter 72 and the input capacitance of NAND gate 74.

The output 71 of circuit 70 is the clock input to flip-flop 80. When the clock makes a positive going transition, flip-flop 80 is set to a condition corresponding to that present at its D-input. Thus, if the D-input is low, Q is set low and if the input is high Q is set high. The information set into flip-flop 80 by the pulse applied to its clock input is maintained until the next pulse is applied to its clock input. The clocking of the flip-flop 80 at positive going edge has a significant advantage. This is done to make sure that information at D-input of flip-flop 80 is ready when it is clocked, and the pulse width at input 71 insures that is sufficient delay.

Figure 5A:
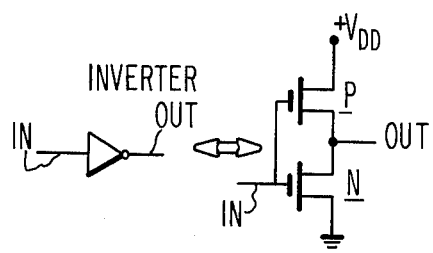
FIGS. 5A and 5B are schematic diagrams of various circuits which may be used in the blocks of FIG. 1.
Figure 5B:
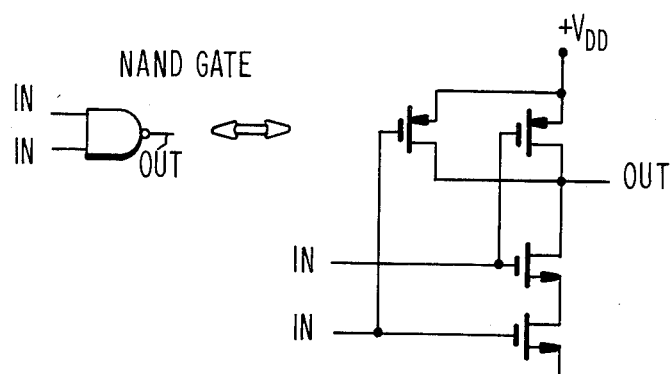

Circuits embodying the invention are preferably manufactured using complementary field effect transistors. As shown in FIG. 5A, each of the inverters of FIG. 1 may include a pair of complementary transistors having their source-to-drain paths connected in series between $+V_{DD}$ volts and ground. The gates of the transistors are connected in common to an input point and the drains of the transistors are connected in common to an output point. As shown in FIG. 5B, each of the NAND gates of FIG. 1 may include two transistors of P-conductivity type having their conduction paths connected in parallel and two transistors of N-conductivity type having their source drain paths connected in series between the output of the gate and ground potential. For a two-input NAND-gate one pair of complementary transistors have their gates connected in common to one input point and the gates of the other pair of complementary transistors are connected in common to a second input point. The NOR gates shown in FIG. 1 could be constructed of the gates 50a and 50b of FIG. 4.

In summary, in circuits embodying the invention the generation of signals occurs during a sampling interval. The sampling interval is determined by a sampling pulse generated by an oscillator integral to the system. Since every event is keyed to the sampling pulse, the accuracy and stability of the oscillator is in no way critical.

Sampling pulses are fed to two circuits. The transfer function of one of the circuits used as a reference circuit is fixed while the transfer function of the other circuit used as a signal steering circuit is altered as a function of the sensor impedance. Note that except for the sensor the two circuits are extremely similar ensuring that both circuits vary in a similar manner to the various environmental conditions in which the circuit is placed. The outputs of the two circuits are compared and subtracted from each other. All sorts of variations not due to actual sensor inputs will be cancelled out of the system.

All the elements of the system except for the sensor 90 may be fabricated on one integrated circuit chip. The simplicity of the circuitry and its low power usage make it easy to integrate the circuit and manufacture the circuit on one chip.

What is claimed is:

1. A comparator circuit for producing an output signal indicative of which one of two signals has the greater amplitude during a sampling interval comprising:
a flip-flop having first and second inputs, an output, and two terminals for the application therebetween of an operating potential;

means for applying one of said two signals to said first input;

means for applying the other of said two signals to said second input; and means for applying, during said sampling interval, an increasing operating potential across said two terminals for causing said flip-flop to pass through a linear range of operation, said flip-flop assuming a condition determined by the difference between said first and second signals while passing through said linear range.

2. The combination as claimed in claim 1 wherein said means for applying an operating potential includes an inverter having an input and an output and which in response to a first signal applied to its input, provides a high operating potential at its output and which in response to a second signal at its input provides a low operating potential at its output;

means connecting the output of said inverter to one of said two terminals of said flip-flop; and wherein the other one of said two terminals of said flip-flop is connected to a point of fixed potential.

3. The combination as claimed in claim 1 wherein said flip-flop includes two cross-coupled NOR gates, each NOR gate having an input and an output, the input of one NOR gate being common to said first input and the input of the other NOR gate being common to said second input.

4. The combination as claimed in claim 3 wherein each one of said NOR gates is comprised of insulated-gate field-effect transistors.

5. In combination with a multivibrator having two power terminals for the application therebetween of an operating potential, and first and second input points and an output point, said output being set to one condition when signals applied to said first input are greater in magnitude than the signals applied to said second input and being set to a second condition when the signals applied to said first input are lower in magnitude than the signals applied to said second input, the improvement comprising:

means for applying first and second signals to said first and second input points, respectively; and means selectively applying an increasing operating potential across said two power terminals varying from a low value at which the multivibrator is substantially unresponsive to the difference in the inputs, through a range in which the multivibrator is responsive to the difference in the inputs and then to a higher value at which the multivibrator is statically operated for setting said multivibrator to one of said first and second conditions indicative of which input is of greater magnitude.

* * * * *

UNITED STATES PATENT AND TRADEMARK OFFICE
CERTIFICATE OF CORRECTION

PATENT NO. : 4,042,841
DATED : August 16, 1977
INVENTOR(S) : Vernon Elton Hills et al It is certified that error appears in the above-identified patent and that said Letters Patent are hereby corrected as shown below:

Col. 1, line 20 "and" second occurrence, should be ---are---.

Col. 2, line 23 "intergrated" should be --- integrated ---.

Col. 2, line 25 "oscillators" should be --- oscillator ---.

Col. 2, line 26 "inventers" should be --- inverters ---.

Col. 2, line 48 "gage" should be --- gate ---.

Col. 2, line 51 "in" should be --- a ---.

Col. 3, line 13 after "sensitivity" insert --- desired ---.

Col. 4, line 40 after "ambient" insert --- noise ---.

Col. 4, line 60 after "function of" insert --- the ---.

Col. 4, line 67 "network" should be --- networks ---.

Col. 4, line 69 "and" should be --- or ---.

UNITED STATES PATENT AND TRADEMARK OFFICE
CERTIFICATE OF CORRECTION

PATENT NO. : 4,042,841
DATED : August 16, 1977
INVENTOR(S) : Vernon Elton Hills et al It is certified that error appears in the above-identified patent and that said Letters Patent are hereby corrected as shown below:

Col. 5, line 24 "none" should be --- node ---.
Col. 5, line 51 "$V_t$" should be --- $V_T$ ---.
Col. 6, line 41 "time" should be ---times---.
Col. 6, line 42 after "going" insert --- power ---.
Col. 6, line 47 "the" (first occurrence) should be ---that---.
Col. 6, line 57 "the" (second occurrence) should be ---to---.
Col. 6, line 65 "—a section" should be --- — the "a" section ---.
Col. 8, line 17 "that" should be --- there ---.

Signed and Sealed this

Tenth Day of January 1978

[SEAL]

Attest:

RUTH C. MASON
Attesting Officer

LUTRELLE F. PARKER
Acting Commissioner of Patents and Trademarks